United States Patent
Feng et al.

(10) Patent No.: US 9,082,660 B2
(45) Date of Patent: Jul. 14, 2015

(54) METHOD OF CONTROLLING THRESHOLD VOLTAGE AND METHOD OF FABRICATING SEMICONDUCTOR DEVICE

(71) Applicant: United Microelectronics Corp., Hsinchu (TW)

(72) Inventors: Ji Feng, Singapore (SG); Hai-Long Gu, Singapore (SG); Ying-Tu Chen, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/965,600

(22) Filed: Aug. 13, 2013

(65) Prior Publication Data

US 2015/0050751 A1 Feb. 19, 2015

(51) Int. Cl.
H01L 21/00 (2006.01)
H01L 21/66 (2006.01)
H01L 21/762 (2006.01)

(52) U.S. Cl.
CPC .......... *H01L 22/12* (2013.01); *H01L 21/76237* (2013.01); *H01L 21/76205* (2013.01)

(58) Field of Classification Search
USPC ................... 438/173, 194, 217, 289
See application file for complete search history.

(56) References Cited

U.S. PATENT DOCUMENTS

| 6,204,073 B1 * | 3/2001 | Nandakumar et al. .......... 438/17 |
| 6,261,920 B1 * | 7/2001 | Oyamatsu ..................... 438/424 |
| 6,482,660 B2 | 11/2002 | Conchieri et al. |
| 2004/0126962 A1 * | 7/2004 | Ma et al. ...................... 438/248 |
| 2005/0142673 A1 * | 6/2005 | Ishii et al. ....................... 438/18 |

OTHER PUBLICATIONS

Wolf, et al., "Silicon Processing for the VLSI era: vol. 1—Process Technology", 2000, 2nd edition, pp. p. 304, 314-316, 419-425, and 818-821.*

* cited by examiner

*Primary Examiner* — Matthew Reames
*Assistant Examiner* — Vincent Wall
(74) *Attorney, Agent, or Firm* — J.C. Patents

(57) ABSTRACT

A method of controlling a threshold voltage is provided. The method of controlling a threshold voltage includes performing a film-thickness measuring step to measure the thickness of a film layer on a wafer to obtain a film-thickness value. Then, at least one parameter is decided, selected, or generated according to the film-thickness value. Next, an ion implantation process is performed on the wafer, wherein the ion implantation process is executed according to the parameter to form a threshold voltage adjustment region in the wafer below the film layer.

16 Claims, 7 Drawing Sheets

METHOD OF CONTROLLING THRESHOLD VOLTAGE AND METHOD OF FABRICATING SEMICONDUCTOR DEVICE

BACKGROUND OF THE INVENTION

1. Field of the Invention

The invention relates to a method of fabricating an integrated circuit, and more particularly, to a method of controlling a threshold voltage and a method of fabricating a semiconductor device.

2. Description of Related Art

Threshold voltage (Vt) is used for determining the reference voltage of turning on and off a transistor. In order to match the electrical properties of the various transistors in the integrated circuit with the same voltage source, the control of the threshold voltage is relatively important in the fabrication of ICs, especially to the current designs of low power and low voltage. Currently, the adjustment of the threshold voltage is done through an ion implantation process, wherein the parameter of the ion implantation is adjusted according to an empirical value and the dopant is formed on the surface of the substrate. However, the doping concentration and the uniformity of each wafer cannot be accurately controlled by adjusting the parameter of the ion implantation according to the empirical value. As a result, the uniformity of the threshold voltage between wafers is poor.

SUMMARY OF THE INVENTION

The invention provides a method of controlling a threshold voltage. The method of controlling a threshold voltage can accurately control the doping concentration and the uniformity of each wafer.

The invention provides a method of controlling a threshold voltage. The method of controlling a threshold voltage can provide a uniform threshold voltage between wafers.

The method of fabricating a semiconductor device provided by the invention can accurately control the threshold voltage of the device and increase the reliability of the device.

The invention provides a method of controlling a threshold voltage. The method of controlling a threshold voltage includes performing a measuring step of film thickness to measure the thickness of a film layer on a wafer to obtain a film-thickness value, then deciding, selecting, or generating at least one parameter according to the film-thickness value, and then performing an ion implantation process on the wafer, wherein the ion implantation process is executed according to the parameter to form a threshold voltage adjustment region in the wafer below the film layer.

According to an embodiment of the invention, the wafer is selected from a group of wafers and the at least one parameter is used in the ion implantation process of the group of wafers.

According to an embodiment of the invention, the measuring step of film thickness measures the thickness of the film layer on different regions on the wafer, the film-thickness value is the average value of the thickness of each region, and the at least one parameter is decided, selected, or generated according to the film-thickness value to perform the ion implantation process on each region of the wafer.

According to an embodiment of the invention, the measuring step of film thickness measures the thickness of the film layer on different regions on the wafer, and the at least one parameter of each region of the wafer is respectively decided, selected, or generated according to the film-thickness value of each region to respectively perform the ion implantation process on each region of the wafer.

According to an embodiment of the invention, the parameter includes energy or dose.

According to an embodiment of the invention, the film layer is a pad oxide layer or a sacrificial oxide layer.

According to an embodiment of the invention, the dopant of the ion implantation is N-type or P-type.

The invention provides a method of fabricating a semiconductor device. The method of fabricating a semiconductor device includes providing a wafer, wherein a first film layer and an isolation structure are formed on the wafer and the isolation structure passes through the first film layer and forms in the wafer; performing a measuring step of film thickness to measure the thickness of the first film layer to obtain a film-thickness value; deciding, selecting, or generating at least one parameter according to the film-thickness value; and performing an ion implantation process on the wafer, wherein the ion implantation process is executed according to the parameter to form a threshold voltage adjustment region in the wafer below the first film layer.

According to an embodiment of the invention, the wafer is selected from a group of wafers and the at least one parameter is used in the ion implantation of each wafer of the group of wafers.

According to an embodiment of the invention, the wafer is selected from a group of wafers and the above steps are respectively performed on each wafer of the group of wafers.

According to an embodiment of the invention, the measuring step of film thickness measures the thickness of the film layer of different regions of the wafer, the film-thickness value is the average value of the thickness of each region, the at least one parameter is decided, selected, or generated according to the film-thickness value to perform the ion implantation process on each region of the wafer.

According to an embodiment of the invention, the measuring step of film thickness measures the thickness of the film layer on different regions on the wafer, and the at least one parameter of each region of the wafer is respectively decided, selected, or generated according to the film-thickness value of each region to perform the ion implantation process on each region of the wafer.

According to an embodiment of the invention, the parameter includes energy or dose.

According to an embodiment of the invention, the first film layer is a pad oxide layer and the step of removing a mask layer on the pad oxide layer after forming the isolation structure is further included.

According to an embodiment of the invention, the method of fabricating the semiconductor device further includes removing a mask layer and a second film layer on the wafer after forming the isolation structure and before forming the first film layer.

According to an embodiment of the invention, the method of forming the first film layer includes a tube furnace growth method or a rapid thermal oxidation process.

According to an embodiment of the invention, the dopant of the ion implantation process is N-type or P-type.

The method of controlling a threshold voltage of the invention can accurately control the doping concentration and the uniformity of each wafer.

The method of controlling a threshold voltage of the invention can provide a uniform threshold voltage between wafers.

The method of fabricating a semiconductor device of the invention adjusts a parameter of an ion implantation process of a threshold voltage adjustment region according to a film thickness and can accurately control the threshold voltage of the device and increase the reliability of the device.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
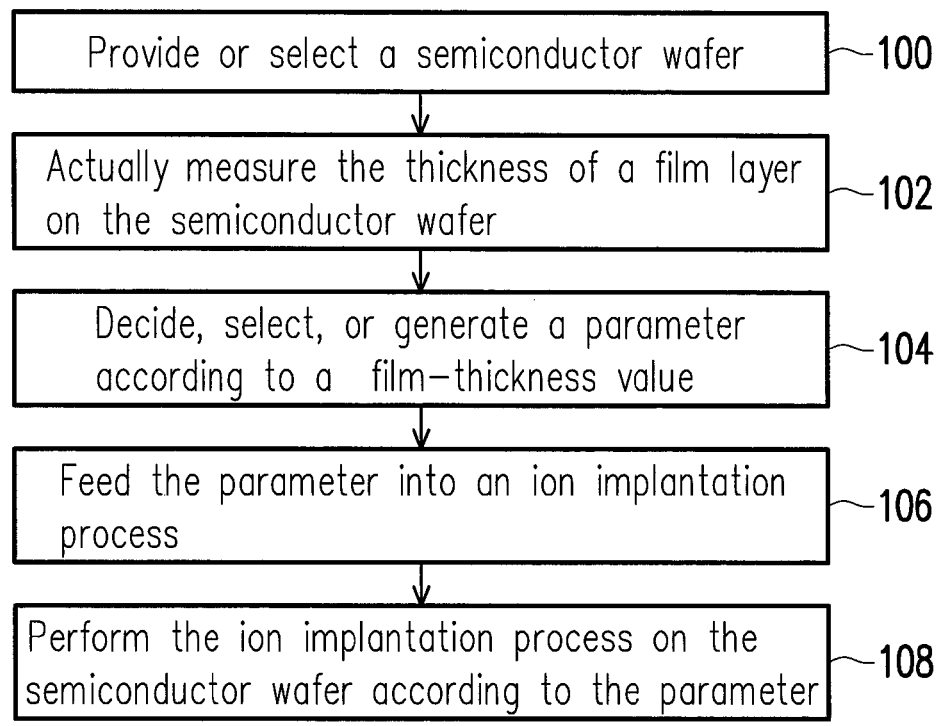
FIG. 1A is a flowchart of a method of fabricating a semiconductor device illustrated according to an embodiment of the invention.
Figure 1B:
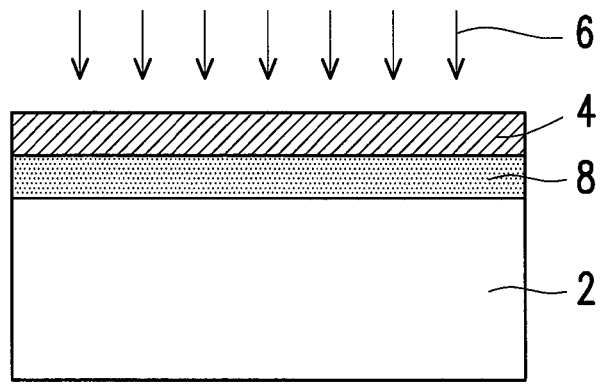
FIG. 1B is a cross-sectional diagram of a method of fabricating a semiconductor device illustrated according to an embodiment of the invention.

FIG. 1A is a flowchart of a method of fabricating a semiconductor device illustrated according to an embodiment of the invention. FIG. 1B is a cross-sectional diagram of a method of fabricating a semiconductor device illustrated according to an embodiment of the invention.

Referring to FIGS. 1A and 1B, in step 100, a semiconductor wafer 2 is provided or selected. A film layer 4 is formed on the semiconductor wafer 2. The film layer 4 can be a single-layer or a multi-layer. In an embodiment, the film layer 4 includes a dielectric layer or other film layers on the surface of the silicon substrate. The dielectric layer is, for instance, a silicon oxide layer. The silicon oxide layer can be a pad oxide layer or a sacrificial oxide layer. The thickness of the film layer 4 is, for instance, 10 angstroms to 300 angstroms.

Referring to FIG. 1A, in step 102, an actual measuring step of film thickness is performed on the film layer 4 on the semiconductor wafer 2 to obtain at least one film-thickness value. The measuring step of film thickness can include measuring the thickness of the film layer on a plurality of regions on the wafer to obtain the film-thickness value of each region or the average value of the film thickness of each region, such as the average value of 9 regions or 21 regions. The measuring step of film thickness can be executed by using a machine for independent measurement or a machine for subsidiary measurement in a manufacturing machine.

Referring to FIG. 1A and FIG. 1B, in step 104, the parameter of a subsequently performed ion implantation process 6 is decided, selected, or generated according to the measured film-thickness value of the film layer 4. The step can be executed with an advanced process control (APC) system. The APC has a database therein. The database includes the conductivity type of the ion implantation, the type of the dopant, and a search table or a search program of the corresponding relationship between the parameter of the ion implantation process and the material and the film thickness of the film layer 4. The conductivity type of the dopant implanted by the ion implantation process is, for instance, N-type or P-type. The type of the dopant is, for instance, boron trifluoride, phosphorous, or arsenic. The parameter of the ion implantation process is, for instance, energy or dose. The material of the film layer 4 is, for instance, silicon oxide. More specifically, the search table or the search program includes the corresponding relationship of a film thickness of the actual measurement of the film layer of various film layers 4 and the threshold voltage obtained by performing various ion implantation processes of various parameters, wherein the various parameters are changed by using a film layer having the film thickness of the actual measurement of the film layer of various film layers 4 as the cover layer.

Figure 2A:
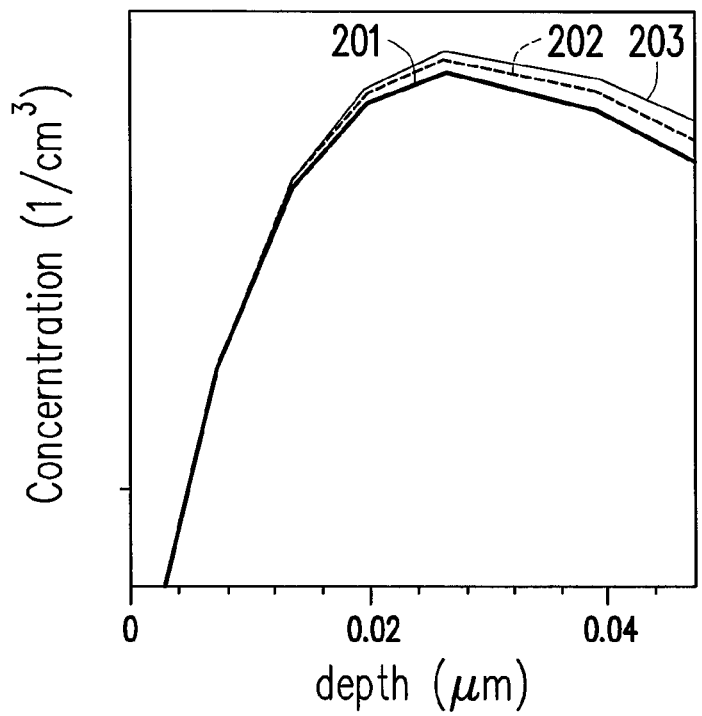
FIG. 2A illustrates a concentration distribution curve of implanting boron trifluoride into a threshold voltage adjustment region formed below oxide layers of various thicknesses.
Figure 2B:
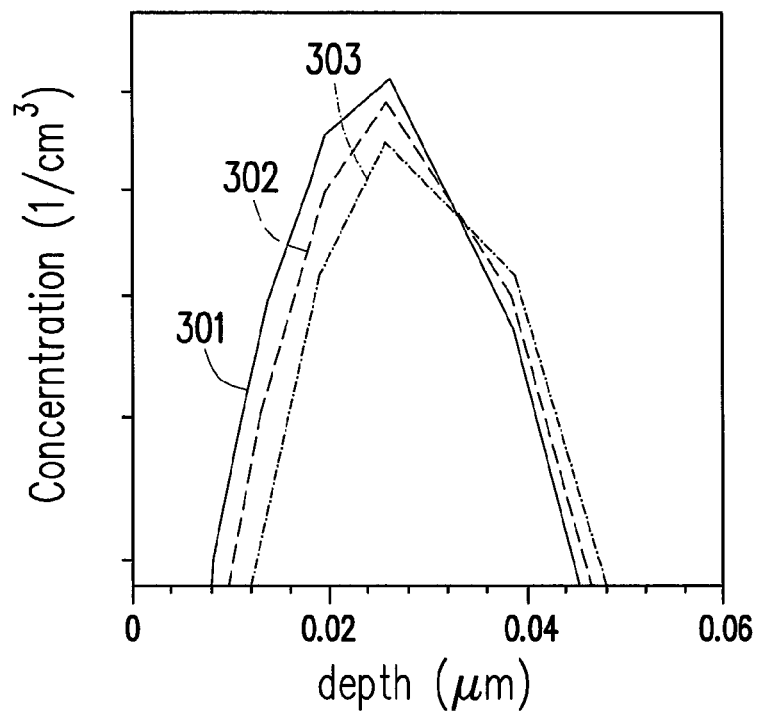
FIG. 2B illustrates a concentration distribution curve of implanting arsenic into a threshold voltage adjustment region formed below oxide layers of various thicknesses.

FIG. 2A illustrates a concentration distribution curve of implanting boron trifluoride into a threshold voltage adjustment region formed below oxide layers of various thicknesses. FIG. 2B illustrates a concentration distribution curve of implanting arsenic into a threshold voltage adjustment region formed below oxide layers of various thicknesses. In FIG. 2A, the curves 201, 202, and 203 respectively represent the concentration distribution curves of boron trifluoride obtained by using an oxide layer having a thickness of 120 angstroms, 106 angstroms, and 90 angstroms as the cover layer. In FIG. 2B, the curves 301, 302, and 303 respectively represent the concentration distribution curves of arsenic obtained by using an oxide layer having a thickness of 120 angstroms, 106 angstroms, and 90 angstroms as the cover layer. The results of FIG. 2A and FIG. 2B show that the concentration of boron trifluoride decreases with increasing thickness of the oxide layer. However, the concentration of arsenic increases with increasing thickness of the oxide layer within a distance of 0.032 μm of depth from the surface of the semiconductor wafer. The results show that the concentration distribution is not only affected by the thickness of the oxide layer, but the concentration distribution is also affected by the different types of the dopant.

Referring to FIG. 1A and FIG. 1B, in step 104, after the obtained film-thickness value is fed into the APC system, the parameter of the corresponding ion implantation process 6 can be decided, selected, or generated according to the film-thickness value of the film layer or the corresponding relationship between the conductivity type of the dopant to be implanted or the type of the dopant and the threshold voltage in the search table or the search program of the database. The step can use the APC system to respectively select the parameter of the ion implantation process 6 performed on each region of the semiconductor wafer 2 according to the film-thickness value of the actual measurement of the film layer 4 of each region. Alternatively, the step can also use the APC system to decide, select, or generate the parameter of the ion implantation process 6 performed on all regions of the semiconductor wafer 2 according to the average value of the film thickness of the film layer 4 of each region.

Referring to FIG. 1A and FIG. 1B, in steps 106 and 108, the decided, selected, or generated parameter is fed into the ion implantation process 6 and the ion implantation process 6 is performed on the selected semiconductor wafer 2 according to the parameter such that a doped region 8 formed below the film layer 4 has the needed doping concentration and the doping profile. In an embodiment, the decided, selected, or generated corresponds to a plurality of parameters of a plurality of regions, and an ion implantation process is respectively performed on each region of the selected semiconductor wafer 2 according to the obtained parameter. In another embodiment, the decided, selected, or generated corresponds to a single parameter of a plurality of regions, and the ion implantation process 6 is performed on all regions of the semiconductor wafer 2 according to the obtained parameter. In an embodiment, the ion implantation process 6 is, for instance, an adjustment step of threshold voltage for controlling the needed threshold voltage of the doped region 8 (threshold voltage adjustment region) of the semiconductor wafer 2 formed below the film layer 4. The dopant implanted by the ion implantation process 6 can be N-type or P-type. The N-type dopant is, for instance, phosphorous or arsenic. The P-type dopant is, for instance, boron trifluoride.

Figure 3A:
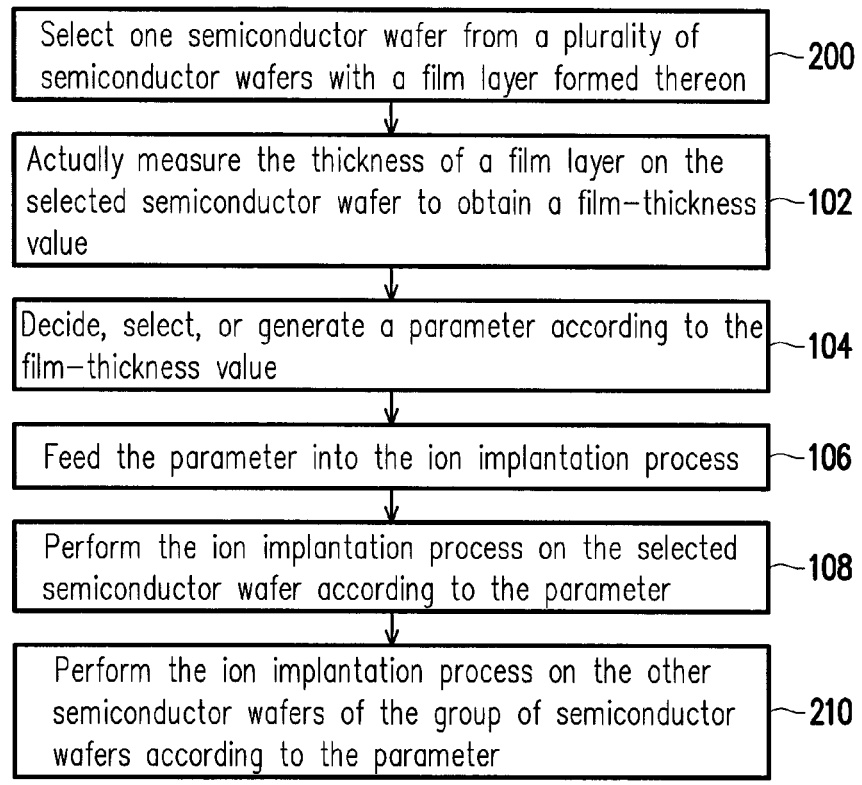
FIG. 3A is a flowchart of a method of fabricating a group of semiconductor devices illustrated according to an embodiment of the invention.

FIG. 3A is a flowchart of a method of fabricating a group of semiconductor devices illustrated according to an embodiment of the invention.

In an embodiment, referring to FIG. 3A and FIG. 1B, in step 200, the method of fabricating a semiconductor device of the invention can include selecting a semiconductor wafer 2 from a group of semiconductor wafers 2 with the film layer 4 formed thereon, and then, according to the method of steps 102, 104, 106, and 108, deciding, selecting, or generating the parameter of the ion implantation process 6 performed on the semiconductor wafer 2 according to the film-thickness value obtained from the actual measurement of the film layer 4 of the selected semiconductor wafer 2, and lastly performing the ion implantation process 6 on the selected semiconductor wafer 2. Then, in step 210, the ion implantation process 6 is performed on the other semiconductor wafers 2 of the group of semiconductor wafers 2 according to the decided, selected, or generated parameter of the ion implantation process 6 performed. In other words, the measurement of film thickness of the film layer 4 is performed on only one of the entire group of semiconductor wafers 2. Then, the parameter of the ion implantation process 6 performed on the entire group of semiconductor wafers 2 is decided, selected, or generated according to the measured film-thickness value. Lastly, the ion implantation process 6 is performed on the entire group of semiconductor wafers 2 according to the obtained parameter.

Figure 3B:
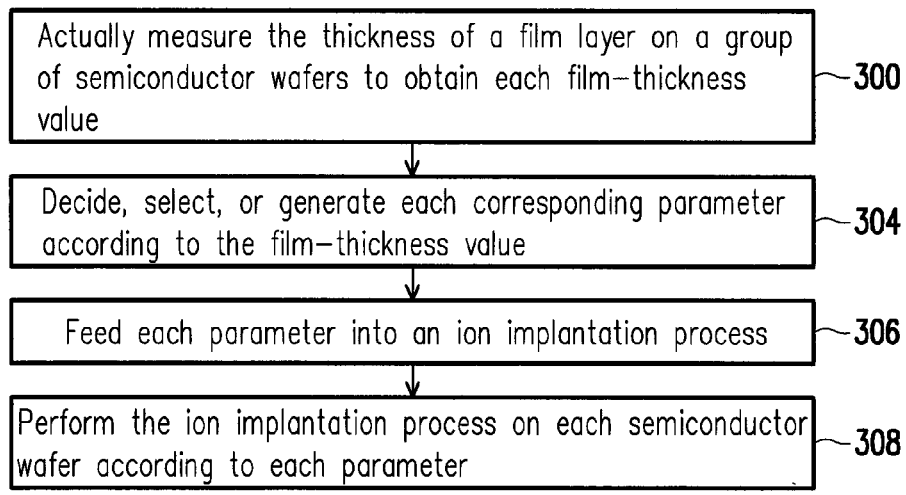
FIG. 3B is a flowchart of another method of fabricating a group of semiconductor devices illustrated according to an embodiment of the invention.

FIG. 3B is a flowchart of another method of fabricating a group of semiconductor devices illustrated according to an embodiment of the invention.

In another embodiment, referring to FIG. 3B and FIG. 1B, in the present embodiment, in step 300, a measurement of film thickness is respectively performed on the film layer 4 of each of the group of semiconductor wafers 2 with the film layer 4 formed thereon to obtain each film-thickness value. Then, in step 304, the parameter of the ion implantation process 6 performed on each semiconductor wafer 2 is decided, selected, or generated according to the measured film-thickness value of the film layer 4 of each semiconductor wafer 2. Next, in step 306, each parameter is respectively fed into the ion implantation process of each semiconductor wafer 2. Then, in step 308, the ion implantation process 6 is performed on each semiconductor wafer 2 according to each obtained parameter.

In the embodiments, the measurement of film thickness of the film layer 4 is performed on only one of the entire group of semiconductor wafers 2. Then, the parameter of the ion implantation process 6 performed on the entire group of semiconductor wafers 2 is decided, selected, or generated according to the measured film-thickness value. Lastly, the ion implantation process 6 is performed on the entire group of semiconductor wafers 2 according to the obtained parameter. Alternatively, the measurement of film thickness of the film layer 4 is individually performed on each of the group of semiconductor wafers 2. Then, the parameter of the ion implantation process 6 performed on each semiconductor wafer 2 is decided, selected, or generated according to the measured film-thickness value of the film layer 4 of each semiconductor wafer 2. Lastly, the ion implantation process 6 is performed on each semiconductor wafer 2 according to the obtained parameter. However, the invention is not limited thereto. In the embodiments of the invention, the measurement of film thickness of the film layer 4 can also be performed on several of the entire group of semiconductor wafers 2 according to the region or actual needs. Then, the parameter of the ion implantation process 6 performed on several semiconductor wafers 2 in the entire group of semiconductor wafers 2 is decided, selected, or generated according to the measured film-thickness value. Lastly, the ion implantation process 6 is performed on several semiconductor wafers 2 in the entire group of semiconductor wafers 2 according to the obtained parameter.

FIGS. 4A through 4E are schematic cross-sectional diagrams of a method of fabricating a semiconductor device illustrated according to the first embodiment of the invention.

Figure 4A:
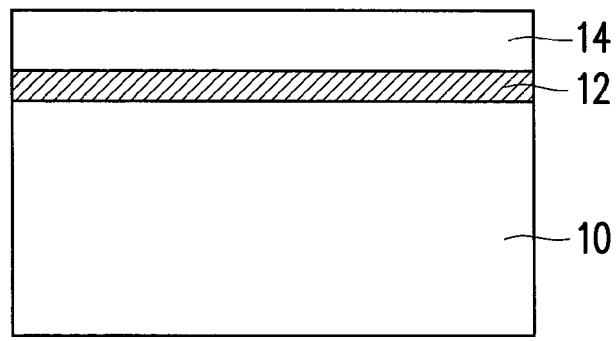
FIGS. 4A through 4E are schematic cross-sectional diagrams of a method of fabricating a semiconductor device illustrated according to the first embodiment of the invention.

Referring to FIG. 4A, a semiconductor wafer 10 is provided, and a pad oxide layer 12 and a mask layer 14 are sequentially formed on the semiconductor wafer 10. The method of forming the pad oxide layer 12 is, for instance, a tube furnace growth method or a rapid thermal oxidation (RTO) method, and the thickness is, for instance, 10 angstroms to 300 angstroms. The material of the mask layer 14 is, for instance, silicon nitride, and the method of formation is, for instance, chemical vapor deposition.

Figure 4B:
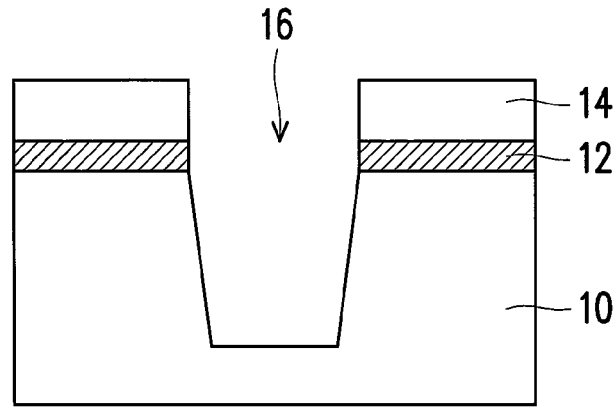

Referring to FIG. 4B, the mask layer 14 and the pad oxide layer 12 are patterned and a trench 16 is formed in the semiconductor wafer 10 using photolithography and etching processes.

Figure 4C:
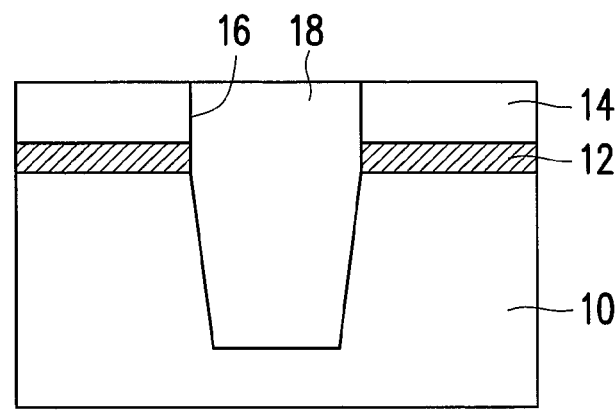

Referring to FIG. 4C, an isolation structure 18 is formed in the trench 16 to define an active region in the semiconductor wafer 10. The method of forming the isolation structure 18 is, for instance, forming an insulating material on the semiconductor wafer 10. The insulating material is, for instance, silicon oxide, and the method of formation is, for instance, chemical vapor deposition. Then, using the mask layer 14 as an etch stop layer, a chemical mechanical polishing (CMP) process is performed to remove the insulating material outside the trench 16.

Figure 4D:
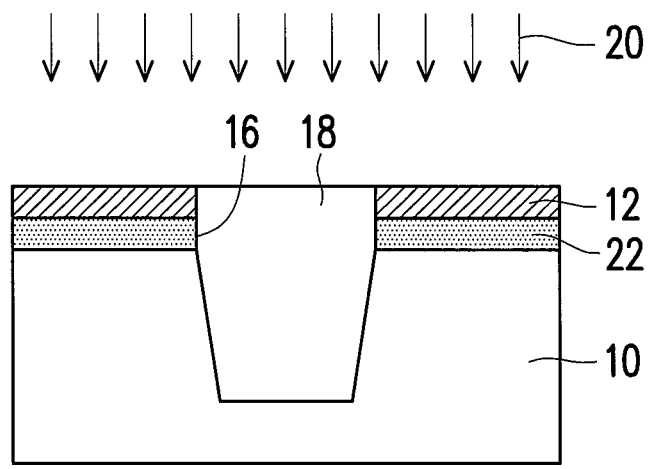

Referring to FIG. 4D, the mask layer 14 is removed to expose the pad oxide layer 12. Then, the film thickness of the pad oxide layer 12 is measured according to the method corresponding to FIG. 1A, and after deciding, selecting, or generating the parameter for performing an ion implantation process 20, the ion implantation process 20 of the threshold voltage adjustment is performed on the active region of the semiconductor wafer 10 to form the threshold voltage adjustment region 22 in the semiconductor wafer 10 below the pad oxide layer 12.

Figure 4E:
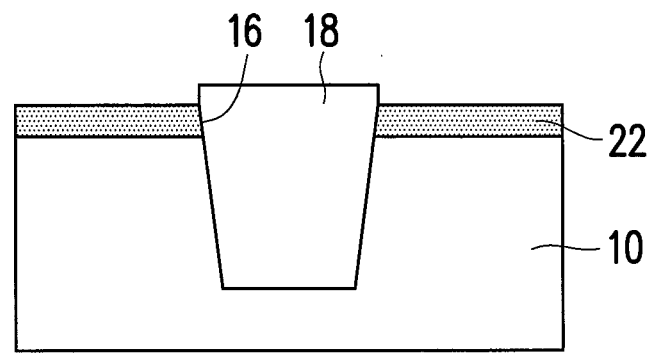

Then, referring to FIG. 4E, the pad oxide layer 12 is removed.

Since the ion implantation process 20 adjusts the parameter of the ion implantation process 20 forming the threshold voltage adjustment region 22 according to the thickness of the pad oxide layer 12, therefore, the profile of the concentration distribution of the formed threshold voltage adjustment region 22 can provide the device with the needed threshold voltage.

FIGS. 5A to 5E are schematic cross-sectional diagrams of a method of fabricating a semiconductor device illustrated according to the first embodiment of the invention.

Figure 5A:
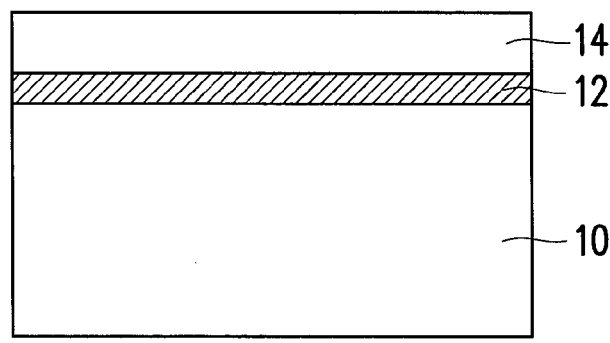
FIGS. 5A through 5E are schematic cross-sectional diagrams of a method of fabricating a semiconductor device illustrated according to the second embodiment of the invention.
Figure 5B:
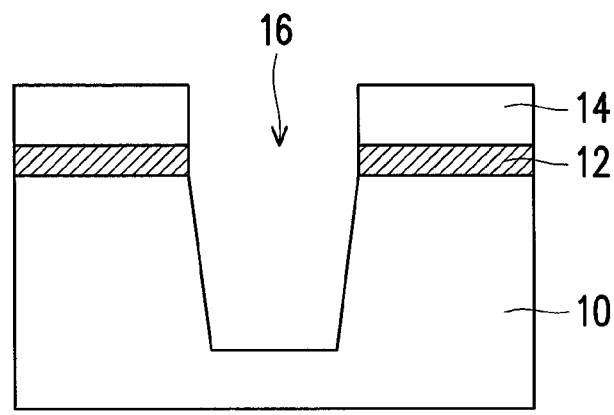

Referring to FIG. 5A, a semiconductor wafer 10 is provided, and a pad oxide layer 12 and a mask layer 14 are sequentially formed on the semiconductor wafer 10. Referring to FIG. 5B, the mask layer 14 and the pad oxide layer 12 are patterned and a trench 16 is formed in the semiconductor wafer 10 using photolithography and etching processes.

Figure 5C:
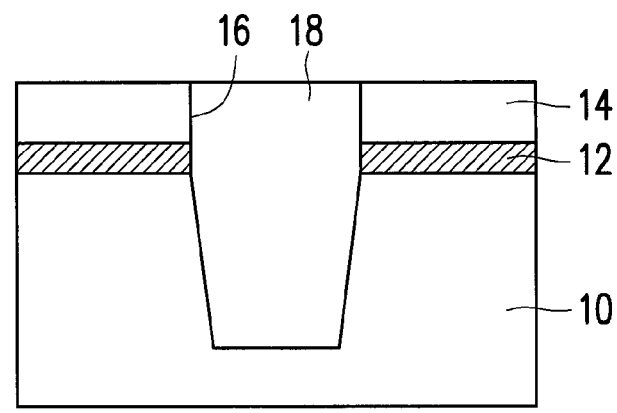

Referring to FIG. 5C, the isolation structure 18 is formed in the trench 16 to define an active region in the semiconductor wafer 10.

Figure 5D:
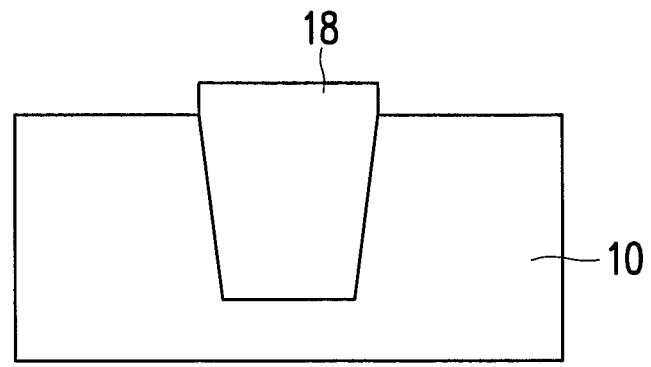

Referring to FIG. 5D, the mask layer 14 and the pad oxide layer 12 are removed to expose the surface of the semiconductor wafer 10.

Figure 5E:
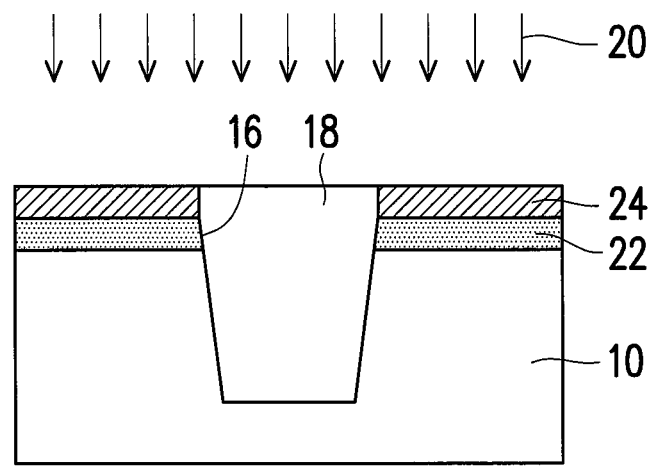

Then, referring to FIG. 5E, a sacrificial oxide layer 24 is formed on the surface of the semiconductor wafer 10. The method of forming the sacrificial oxide layer 24 is, for instance, a tube furnace growth method or an RTO method, and the thickness is, for instance, 10 angstroms to 300 angstroms.

Then, the film thickness of the sacrificial oxide layer 24 is measured according to the method of the flowchart corresponding to the method of fabricating a semiconductor device of FIG. 1A, and after deciding, selecting, or generating the parameter for performing the ion implantation process 20, the ion implantation process 20 of the threshold voltage adjustment is performed on the active region of the semiconductor wafer 10 to form the threshold voltage adjustment region 22 below the sacrificial oxide layer 24.

Since the ion implantation process 20 adjusts the implantation parameter thereof according to the thickness of the sacrificial oxide layer 24, the sacrificial oxide layer 24 grows back on the semiconductor wafer 10 after the pad oxide layer 12 is removed. Therefore, the thickness of the sacrificial oxide layer 24 does not become uneven due to cleaning or etching processes. Therefore, the implantation parameter of the threshold voltage adjustment region 22 is adjusted according to the thickness of the sacrificial oxide layer 24. As a result, the threshold voltage of the device can be effectively controlled and the reliability of the device is increased.

Experiments confirm that, by using the methods of the embodiments, regarding the NMOS device having a shorter channel (0.3×0.06 µm), the uniformity of the current thereof can be increased by 1.0%. Regarding the longer (10×10 µm) NMOS device, the uniformity of the current thereof can be increased by 17.8%. Regarding the PMOS device having a shorter channel (0.3×0.06 µm), the uniformity of the current thereof can be increased by 10.8%. Regarding the longer (10×10 µm) PMOS device, the uniformity of the current thereof can be increased by 41.6%.

Based on the above, the methods of the embodiments of the invention adjust the implantation parameter of the threshold voltage adjustment region according to the film thickness. As a result, the device can have the needed threshold voltage and the reliability of the device is increased.

Although the invention has been described with reference to the above embodiments, it will be apparent to one of the ordinary skill in the art that modifications and variations to the described embodiments may be made without departing from the spirit and scope of the invention. Accordingly, the scope of the invention will be defined by the attached claims not by the above detailed descriptions.

What is claimed is:

1. A method of fabricating a semiconductor device, comprising:
   providing a wafer, wherein providing a wafer comprises forming a first film layer and an isolation structure, and a mask layer on the wafer, wherein the isolation structure passes through the first film layer and is formed in the wafer, wherein the mask layer is formed on the first film layer,
   wherein the first film layer is a pad oxide layer, and further comprising removing the mask layer on the pad oxide layer after forming the isolation structure;
   performing a film-thickness measuring step to measure a thickness of the first film layer to obtain a film-thickness value;
   deciding, selecting, or generating at least one parameter according to the film-thickness value; and
   performing an ion implantation process on the wafer, wherein the ion implantation process is executed according to the parameter to form a threshold voltage adjustment region in the wafer below the first film layer.

2. The method of claim 1, wherein the wafer is selected from a group of wafers and the at least one parameter is used in the ion implantation process of each wafer of the group of wafers.

3. The method of claim 1, wherein the wafer is selected from a group of wafers and the steps of claim 1 are respectively performed on each wafer of the group of wafers.

4. The method of claim 1, wherein the film-thickness measuring step measures the thickness of the film layer of different regions of the wafer, the film-thickness value is an average value of the thickness of each region, and the at least one parameter is decided, selected, or generated according to the film-thickness value to perform the ion implantation process on each region of the wafer.

5. The method of claim 1, wherein the film-thickness measuring step measures the thickness of the film layer on different regions on the wafer and the at least one parameter of each region of the wafer is respectively decided, selected, or generated according to the film-thickness value of each region to respectively perform the ion implantation process on each region of the wafer.

6. The method of claim 1, wherein the parameter comprises energy or dose.

7. The method of claim 1, wherein a method of forming the first film layer comprises a tube furnace growth method or a rapid thermal oxidation.

8. The method of claim 1, wherein a dopant of the ion implantation process is N-type or P-type.

9. A method of fabricating a semiconductor device, comprising:
   providing a wafer, wherein providing a wafer comprises forming a first film layer, an isolation structure, a mask layer, and a second film layer on the wafer, wherein the isolation structure passes through the first film layer and is formed in the wafer;
   removing the mask layer and the second film layer on the wafer after forming the isolation structure and before forming the first film layer;
   performing a film-thickness measuring step to measure a thickness of the first film layer to obtain a film-thickness value;
   deciding, selecting, or generating at least one parameter according to the film-thickness value; and
   performing an ion implantation process on the wafer, wherein the ion implantation process is executed according to the parameter to form a threshold voltage adjustment region in the wafer below the first film layer.

10. The method of claim 9, wherein the wafer is selected from a group of wafers and the at least one parameter is used in the ion implantation process of each wafer of the group of wafers.

11. The method of claim 9, wherein the wafer is selected from a group of wafers and the steps of claim 9 are respectively performed on each wafer of the group of wafers.

12. The method of claim 9, wherein the film-thickness measuring step measures the thickness of the film layer of different regions of the wafer, the film-thickness value is an average value of the thickness of each region, and the at least one parameter is decided, selected, or generated according to the film-thickness value to perform the ion implantation process on each region of the wafer.

13. The method of claim 9, wherein the film-thickness measuring step measures the thickness of the film layer on different regions on the wafer and the at least one parameter of each region of the wafer is respectively decided, selected, or generated according to the film-thickness value of each region to respectively perform the ion implantation process on each region of the wafer.

14. The method of claim 9, wherein the parameter comprises energy or dose.

15. The method of claim 9, wherein a method of forming the first film layer comprises a tube furnace growth method or a rapid thermal oxidation.

16. The method of claim 9, wherein a dopant of the ion implantation process is N-type or P-type.

* * * * *